United States Patent [19]

Gojohbori

[11] Patent Number: 5,733,801
[45] Date of Patent: Mar. 31, 1998

[54] METHOD OF MAKING A SEMICONDUCTOR DEVICE WITH ALIGNMENT MARKS

[75] Inventor: Hiroshi Gojohbori, Yokohama, Japan

[73] Assignee: Kabushiki Kaisha Toshiba, Tokyo, Japan

[21] Appl. No.: 674,210

[22] Filed: Jul. 1, 1996

Related U.S. Application Data

[62] Division of Ser. No. 362,027, Dec. 21, 1994, abandoned.

[30] Foreign Application Priority Data

Dec. 21, 1993 [JP] Japan .................................. 5-322362

[51] Int. Cl.⁶ .............................................. H01L 21/465
[52] U.S. Cl. ............................ 437/228; 437/61; 437/67
[58] Field of Search ............................ 257/501, 506, 257/797; 437/228, 61, 64, 67, 63

[56] References Cited

U.S. PATENT DOCUMENTS

| | | | |
|---|---|---|---|
| 4,769,687 | 9/1988 | Nakazato et al. | 257/506 |
| 5,272,117 | 12/1993 | Roth et al. | 437/228 |
| 5,350,486 | 9/1994 | Huang | 437/228 |
| 5,604,149 | 2/1997 | Paoli et al. | 437/67 |

FOREIGN PATENT DOCUMENTS

| | | | |
|---|---|---|---|
| 63-181317 | 7/1988 | Japan | 257/797 |

*Primary Examiner*—Charles L. Bowers, Jr.
*Assistant Examiner*—Lynne A. Gurley
*Attorney, Agent, or Firm*—Loeb & Loeb LLP

[57] ABSTRACT

A first trench is formed in an element-separating region on the surface of a semiconductor substrate, and a second trench is formed in an alignment mark region thereof. When a first insulating substance is deposited on the substrate surface so as to bury the first and second trenches, a first insulating film is formed into a recessed shape in both the first and second trenches. A second insulating substance having an etching rate slower than that of the first insulating substance is formed on the first insulating film, and further etched to leave the second insulating film only over the second trench. The overall thickness of the device is reduced in such a way that the upper surface of the first insulating film in the first trench becomes flush with the semiconductor substrate surface. A part of the surface of the insulating substance on the alignment mark portion projects so as to be usable as an alignment mark. Alternatively, when a first trench is formed extending to both the element-separating and alignment mark regions and further when an insulating film is deposited on the substrate surface so as to bury both the first and second trenches, a first projecting insulating film can be formed between the two trenches. A second insulating film whose etching rate is slower than that of the first insulating film is formed on the projecting insulating film and further etched to leave the second insulating film so as to cover only the first projecting insulating film. The overall thickness is reduced in such a way that the upper surface of the first insulating film becomes flush with the semiconductor substrate surface, and further the remaining second insulating film is removed. The remaining first insulating film is usable as an alignment mark portion.

12 Claims, 8 Drawing Sheets

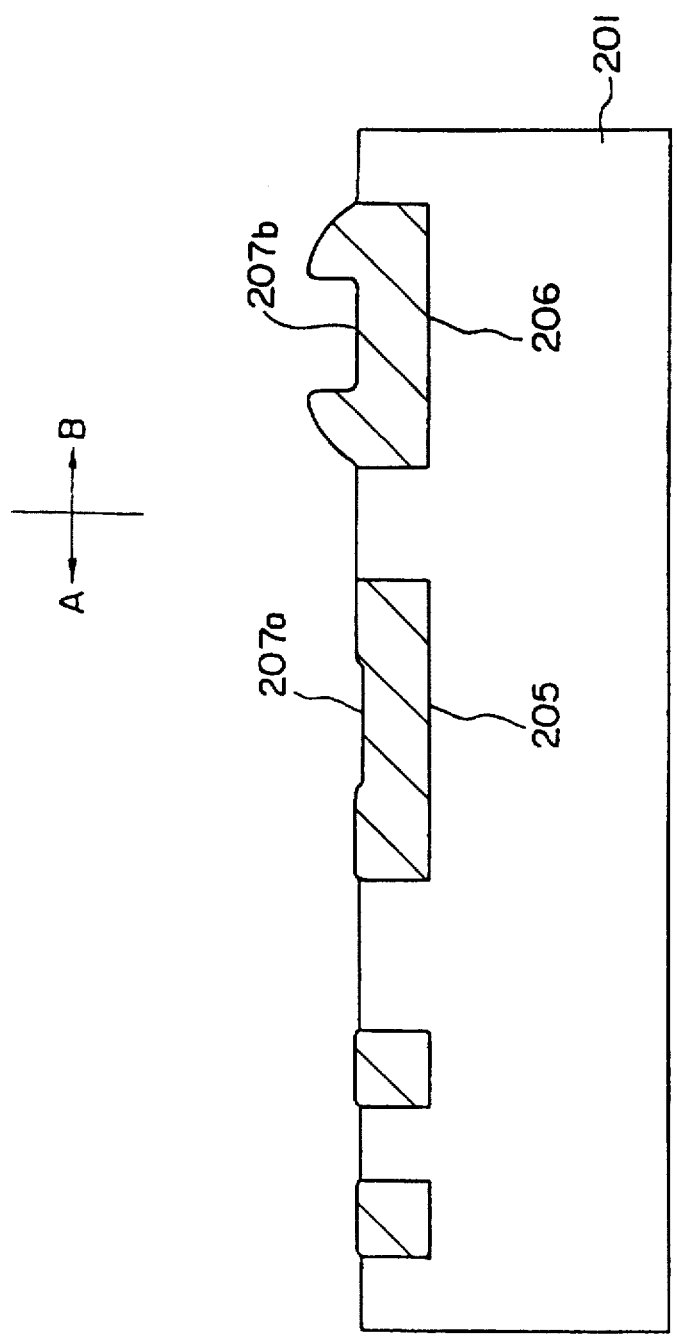
FIG. I

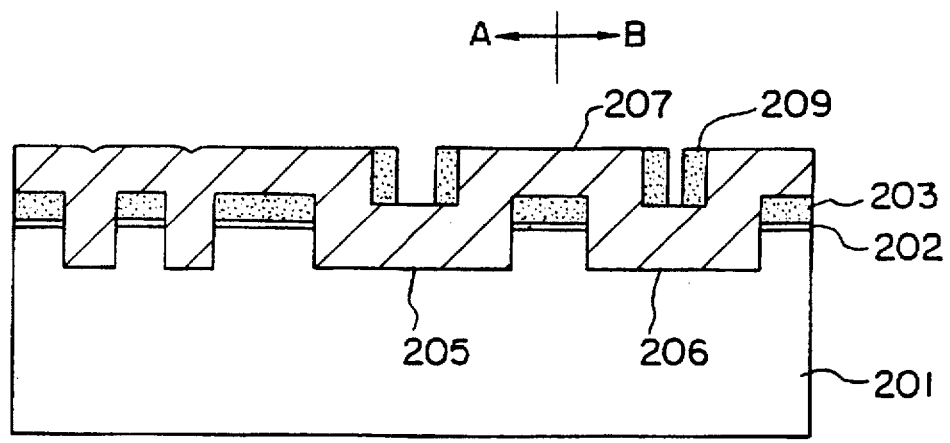
F I G. 3 A
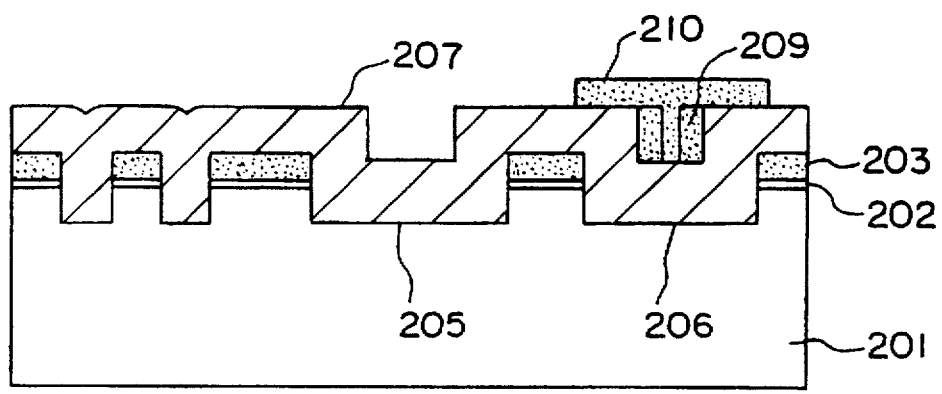
F I G. 3 B
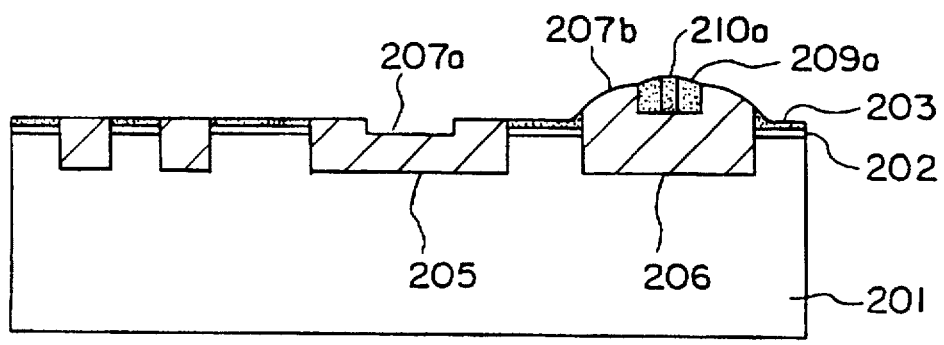
F I G. 3 C

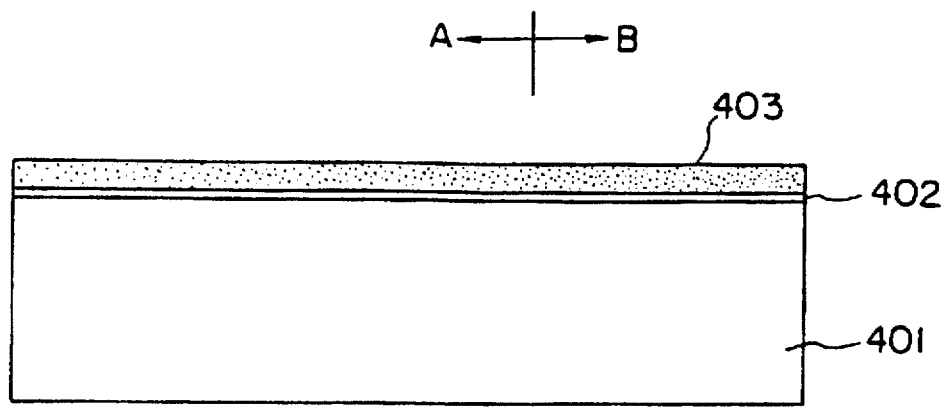
F I G. 5 A
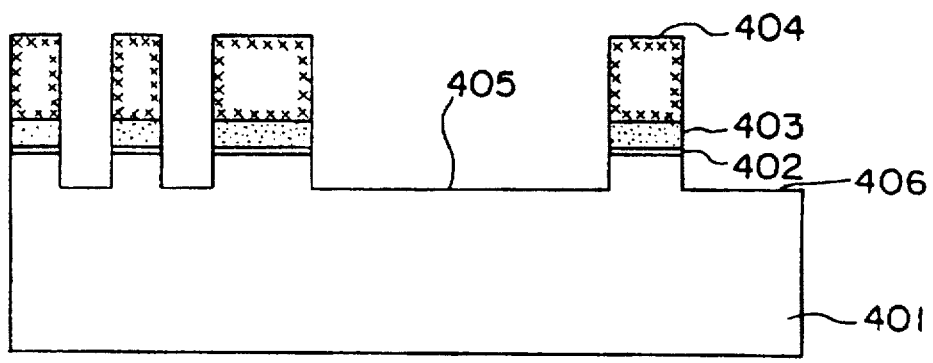
F I G. 5 B
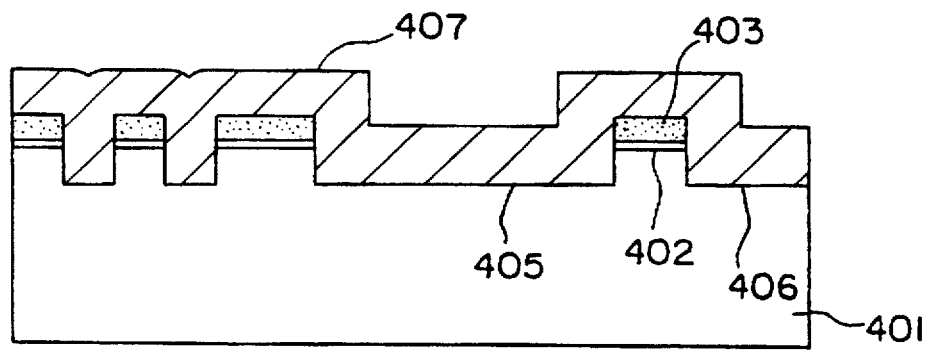
F I G. 5 C

METHOD OF MAKING A SEMICONDUCTOR DEVICE WITH ALIGNMENT MARKS

This is a divisional of application Ser. No. 08/362,027, filed Dec. 21, 1994, now abandoned.

BACKGROUND OF THE INVENTION

1. Field of the Invention

The present invention relates to a semiconductor device and a method of manufacturing the same semiconductor device, and more specifically to a method of forming a mark portion for mask alignment.

2. Description of the Prior Art

As one of the element-separating methods suitable for CMOS, a BOX (buried oxide isolation) method is known such that trenches are formed and an insulating substance is buried in each trench. This BOX method is explained hereinbelow.

First, a first silicon oxide film is deposited on a semiconductor substrate by a CVD (chemical vapor deposition) method, and then a polycrystalline silicon (polysilicon) film is further deposited thereon by the CVD method.

Then, after a photoresist is applied onto the polysilicon film, the photoresist is exposed and developed in accordance with photolithography, to etch the first silicon oxide film and the polycrystal silicon film into a shape corresponding to an element-separating portion. Further, the semiconductor substrate exposed by the above-mentioned etching process is further etched to form an element-separating trench.

After the photoresist has been removed, a second silicon oxide film is further deposited by the CVD method to bury the element-separating trench.

Further, after the whole semiconductor surface has been polished or after a planarize resist has been applied on the second silicon oxide film, the device is etched back by anisotropic etching to remove a part of the second silicon oxide film and the polysilicon. Further, etching is continued until the first silicon oxide film and the polysilicon film can be both removed for surface planarization. Through the process as described above, it is possible to obtain a buried element-separating film.

When highly-integrated semiconductor devices such as LSIs are manufactured, a mask alignment process (for placing light-exposing masks on a semiconductor device at high precision) is one of the important manufacturing techniques. In general, the mask alignment is effected by placing a mask on the semiconductor substrate with the use of a mark portion having a level difference and formed on the semiconductor substrate.

The above-mentioned mask alignment is also required when the semiconductor devices are manufactured in accordance with the element-separating (BOX) method.

Many have tried to form the mark portion at the same time that the element-separating film is formed by the BOX method. However, when the surface of the semiconductor device is planarized, since the mark portion is usually planarized simultaneously, it is difficult to detect the mark portion, so that there exists a problem in that the alignment of a mask with the semiconductor substrate is difficult. To overcome this problem, although some methods form a recessed mark portion wider or deeper than a trench (as the element-separating region), there arises another problem in that the manufacturing process is usually complicated.

SUMMARY OF THE INVENTION

Therefore, it is the object of the present invention to provide a semiconductor device and a method of manufacturing the same, by which trenches can be formed in a semiconductor substrate; the trenches can be buried with an insulating substance; and further detectable mark portions can be formed simultaneously.

To achieve the above-mentioned object, the present invention provides a semiconductor device comprising: an element-separating portion formed by burying an insulating substance in a first trench formed in an element-separating region on a surface of a semiconductor substrate, a surface of said element-separating portion being roughly flush with the surface of the semiconductor substrate; and an alignment mark portion formed by burying an insulating substance in a second trench formed in an alignment mark region on the surface of the semiconductor substrate, a part of a surface of said alignment mark portion being different in level from the surface of the semiconductor substrate.

Further, it is preferable that a part of the surface of the insulating substance of said alignment mark portion projects from the surface of the semiconductor substrate.

Further, the present invention provides a semiconductor device comprising: an element-separating portion formed by burying an insulating substance in a first trench formed extending to both element-separating and alignment mark regions on a surface of a semiconductor substrate having an alignment mark portion thereon, a surface of said element-separating portion being roughly flush with the surface of the semiconductor substrate; and an alignment mark portion formed with an insulating substance on a side wall portion of the film deposited in the alignment mark region on the surface of the semiconductor substrate, said alignment mark portion having a level difference projecting from the surface of the semiconductor substrate.

Further, to achieve the above-mentioned object, the present invention provides a method of manufacturing a semiconductor device, comprising the steps of: selectively forming a first trench in an element-separating region and a second trench in an alignment mark-forming region both on a semiconductor substrate; depositing a first insulating substance all over a surface of the device, to form a first film recessed at least roughly in a central portion of each of the first and second trenches according to shapes of the first and second trenches in such a way as to be flush with the semiconductor substrate surface; depositing a second insulating substance having an etching rate smaller than that of the first insulating substance all over the surface of the device, to form a second film remaining on the first insulating substance in the second trench; reducing a device thickness thereof all over the surface thereof so that an upper surface of the first film in the first trench becomes flush with the semiconductor substrate surface; and removing the second film remaining in the second trench.

Further, it is preferable that the step of reducing the device thickness is an anisotropic etching-back process. Further, the step of forming the second film is to laminate a plurality of films. Further, the second film is a film selected from the group consisting of a silicon nitride film, a polycrystalline silicon (polysilicon) film, a carbon film, a high melting point metal film, a high melting point metal silicide film, a laminated film of the high melting point metal film and the high melting point metal silicide film.

Further, the present invention provides a method of manufacturing a semiconductor device, comprising the steps of: depositing a first film on a semiconductor substrate; forming at least one trench by removing the first film and the semiconductor substrate in both element-separating and alignment mark regions on a surface of the semiconductor substrate having an alignment mark portion thereon; forming a second film by depositing an insulating substance all over the surface of the semiconductor substrate in such a way that the trench is filled therewith and further a projection portion can be formed according to the deposited first film at the alignment mark portion; forming a third film only on a side surface of the formed projection portion; reducing an entire thickness of the device so that an upper surface of the second film become flush with the surface of the semiconductor substrate; and removing the third film remaining on the side surface of the projection portion.

Further, it is preferable that the step of forming the third film is to laminate a plurality of films. Further, the third film is a film selected from the group consisting of a silicon nitride film, a polysilicon film, a carbon film, a high melting point metal film, a high melting point metal silicide film, a laminated film of the high melting point metal film and the high melting point metal silicide film.

BRIEF DESCRIPTION OF THE DRAWINGS

FIG. 1 is a cross-sectional view showing a first embodiment of the semiconductor device according to the present invention;

FIGS. 3A to 3C are cross-section views for assistance in explaining a modification of the first embodiment of the manufacturing process of the semiconductor device shown in FIG. 1;

FIGS. 5A to 5E are cross-section views for assistance in explaining the manufacturing process of the second embodiment of the semiconductor device shown in FIG. 4.

DETAILED DESCRIPTION OF THE EMBODIMENTS

Figure 2A:
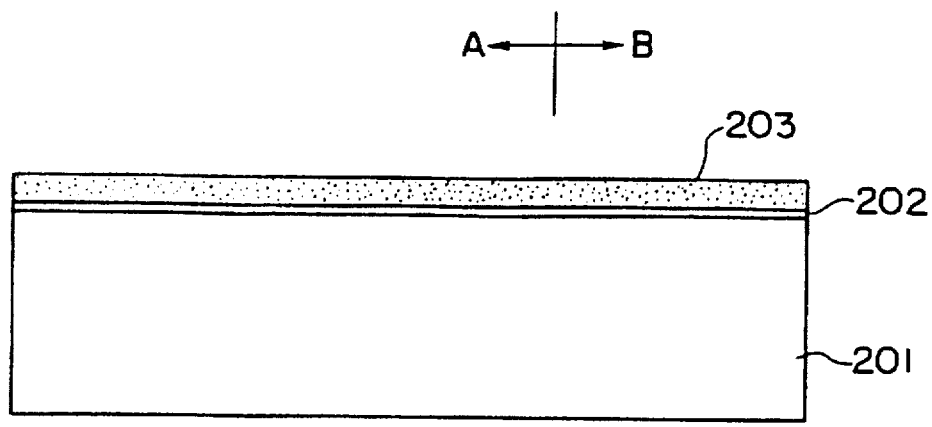
FIGS. 2A to 2E are cross-section views for assistance in explaining the manufacturing process of the first embodiment of the semiconductor device shown in FIG. 1.

FIG. 1 shows a first embodiment of the semiconductor device according to the present invention. In FIG. 1, an element-separating film 207a of silicon oxide film is formed in a trench 205 in an element-separating region A, and a mark portion 207b of silicon oxide film is formed in another trench 206 in a mark portion-forming region B, both on the surface of the semiconductor substrate 201. The element-separating film 207a and the mark portion 207b are both formed in accordance with the BOX (buried oxide isolation) method. As shown in FIG. 1, the element-separating film 207a is formed being roughly flush with the surface of the semiconductor substrate 201, while the mark portion 207b is formed into a recessed shape in cross section so that a part thereof projects from the surface of the semiconductor substrate for providing an easy mask alignment.

FIGS. 2A to 2E are cross-sectional views for assistance in explaining the manufacturing method of obtaining the structure as shown in FIG. 1.

First, as shown in FIG. 2A, a first silicon oxide film 202 with a thickness of about 250 angstroms is formed on the semiconductor substrate 201 in accordance with the CVD (chemical vapor deposition) method, and further a first polysilicon film 203 with a thickness of about 4000 angstroms is formed thereon.

Figure 2B:
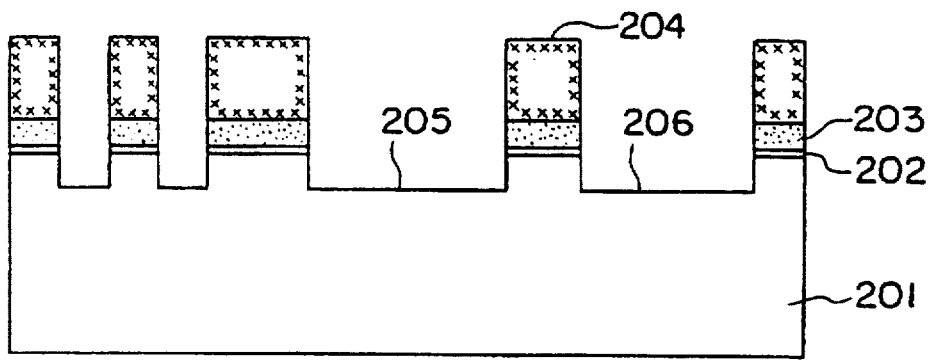

Then, as shown in FIG. 2B, after a photoresist 204 has been applied on the polysilicon film 203, the photoresist is exposed and developed in accordance with photolithography, to etch the first silicon oxide film 202 and the first polysilicon film 203 into the shape of the element-separating portion and the mark portion. The semiconductor substrate 201 exposed by this etching is further etched to form an element-separating trench (first trench) 205 and a mark portion trench (second trench) 206 both with a depth of about 7000 angstroms. Further, in this embodiment, the width of the mark portion trench 206 is narrower than that of the element-separating trench 205.

Figure 2C:
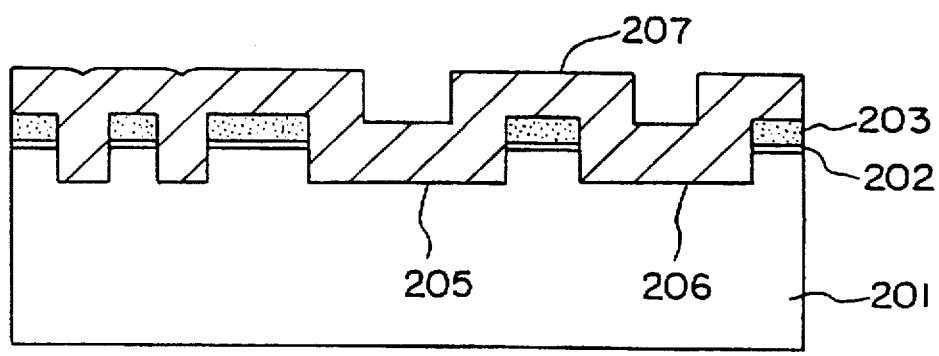

Further, as shown in FIG. 2C, after the photoresist has been removed, a second silicon oxide film 207 (first film) is deposited in accordance with the CVD method, to bury both the trenches 205 and 206. Here, the thickness of the second silicon oxide film 207 is about 10000 angstroms, for instance, which is thicker than the depth of the trenches 205 and 206.

Figure 2D:
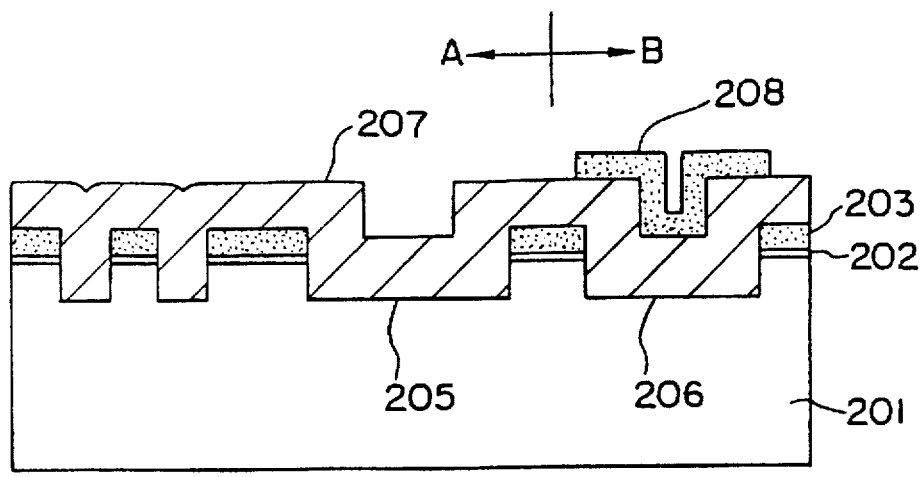

Further, as shown in FIG. 2D, a second polysilicon film 208 with a thickness of about 4000 angstroms is deposited on the second silicon oxide film 207 in accordance with the CVD method, and the deposited second polysilicon film 208 is etched in accordance with photolithography so that the second polysilicon film 208 (second film) remains only on the second silicon oxide film 207 (first film) buried in the trench 206.

Figure 2E:
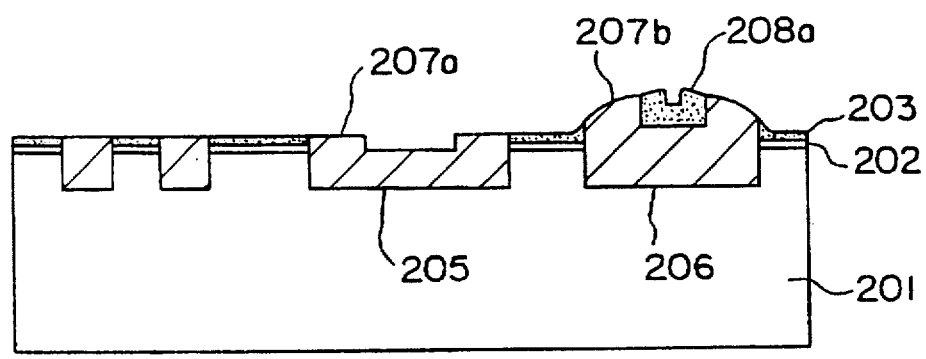

Further, a planarize resist is applied to all the surface of the device, and then the device is etched back by anisotropic etching or polished. In this case, since the second polysilicon film 208 (whose etching speed is slower than that of the second silicon oxide film 207) exists at the mark portion, the second silicon oxide film 207 is not etched as quickly at the mark portion. As a result, as shown in FIG. 2E, at the time point when the second silicon oxide film 207a is etched in the element-separating region to such an extent as to become flush with the first polysilicon film 203, the second polysilicon film 208 is removed only at the uppermost surface thereof at the mark portion 206, and the second silicon oxide film 207b is etched in such a way as to be removed increasingly with increasing distance away from the center of the second polysilicon film 208.

Further, when the etching process is maintained until the first polysilicon film 203 and the first silicon oxide film 202 are both removed, it is possible to obtain the semiconductor device of the structure as shown in FIG. 1.

Here, in the process as explained with reference to FIG. 2D, the second polysilicon film 208 is used so as to remain only on the second silicon oxide film 207 buried in the trench 206 in the mark-forming region B. Without being limited to only polysilicon, however, it is possible to use any material, as long as the material can delay the etching speed of the base film formed thereunder, for instance such as a silicon nitride film, a carbon film, or a high melting point metal film (e.g., tungsten, molybdenum, titanium nitride, titanium, nickel, cobalt, platinum, etc.), or a silicide film of these high melting point metals (e.g., a single layer film of tungsten silicide, molybdenum silicide, titanium silicide, tantalum silicide, etc.) or a laminated film of the high melting point metal film and the high melting point metal silicide film.

FIGS. 3A to 3C show cross-section views for assistance in explaining a modification of the first embodiment of the manufacturing process of the semiconductor device shown in FIG. 1, which follow after the processing steps shown in FIGS. 2A to 2C.

As shown in FIG. 3A, when the second polysilicon film 209 with a thickness of about 4000 angstroms is deposited on the second silicon oxide film 207 in accordance with the CVD method, it is possible to form a film along the recessed portions of the second silicon oxide film 207. Under these conditions, when the anisotropic etching is performed, the second polysilicon film 209 remains only on the side walls of the recessed portions of the second silicon oxide film 207, as shown in FIG. 3A.

Further, a third polysilicon film 210 with a thickness of about 4000 angstroms is on the second silicon oxide film 207 in accordance with the CVD method, and the third polycrystal silicon 210 is left only in the mark portion-forming region B in accordance with the photolithography. Then, as shown in FIG. 3B, it is possible to obtain the condition where the recessed portion of the mark-forming region is completely buried.

Further, a planarize resist is applied to all over the surface of the device, and then the device is etched back by anisotropic etching or polished. In this case, since the second and third polysilicon films 209 and 210 (whose etching speeds are slower than that of the second silicon oxide film 207) exist at the mark portion, the second silicon film 207 is not etched as quickly at the mark portion. As a result, as shown in FIG. 3C, at the time point when the second silicon oxide film 207a is etched in the element-separating region to such an extent as to become flush with the first polycrystal silicon 203, the second and third polysilicon films 209 and 210 are removed only at the uppermost surfaces thereof at the mark portion, and the second silicon oxide film 207b is etched in such a way as to be removed increasingly with increasing distance away from the center of the third polysilicon film 210a.

Further, when the etching process is maintained until the first polysilicon film 203 and the first silicon oxide film 202 are both removed, it is possible to obtain the semiconductor device of the structure as shown in FIG. 1.

Here, in the process as explained with reference to FIGS. 3A and 3B, the second and third polysilicon films 209 and 210 are used so as to remain only on the second silicon oxide film 207 buried in the trench 206 in the mark-forming region B. Without being limited to the polysilicon films 209 and 210, however, it is possible to use any material, as long as the material can delay the etching speed of the base film formed thereunder, for instance such as a silicon nitride film, a carbon film, or a high melting point metal film (e.g., tungsten, molybdenum, titanium nitride, titanium, nickel, cobalt, platinum, etc.), or a silicide film of these high melting point metals (e.g., a single layer film of tungsten silicide, molybdenum silicide, titanium silicide, tantalum silicide, etc.) or a laminated film of the high melting point metal film and the high melting point metal silicide film.

Figure 4:
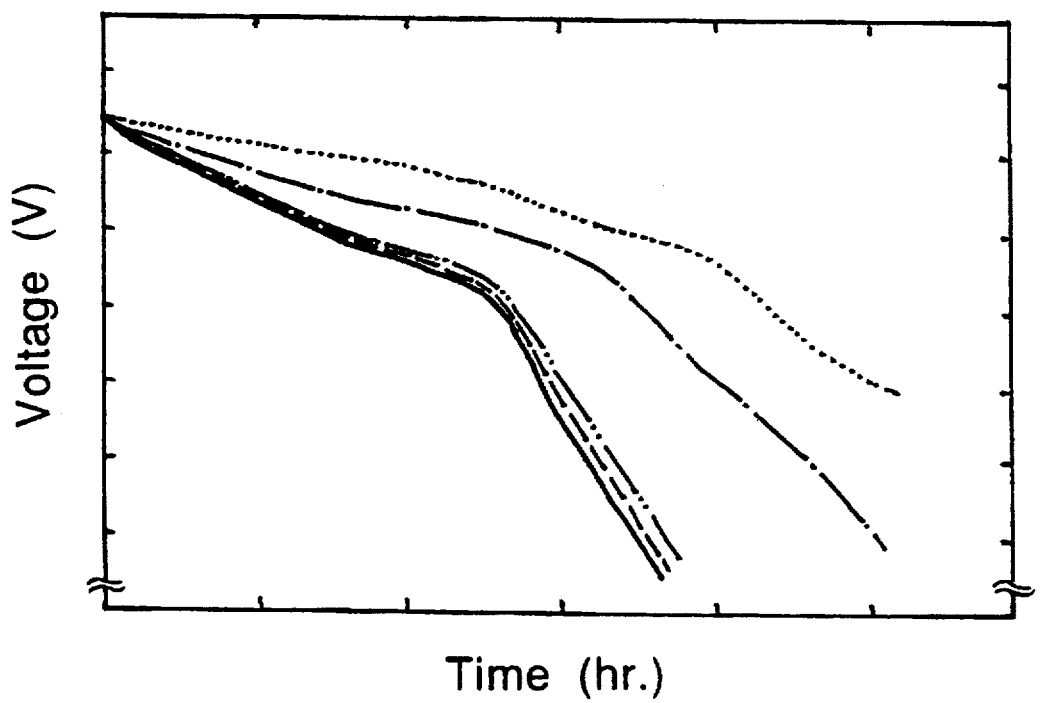
FIG. 4 is a cross-sectional view showing a second embodiment of the semiconductor device according to the present invention.

FIG. 4 shows a second embodiment of the semiconductor device according to the present invention. In FIG. 4, an element-separating region is denoted by an arrow A and the mark-forming region is denoted by an arrow B in the same way as with the case of the first embodiment shown in FIG. 1.

In this second embodiment, a trench 405 is formed on the surface of the semiconductor substrate extending from the element-separating region A to the mark-forming region B; and another trench 406 is formed in the mark-forming region B on the other side of the central portion of the mark. On the semiconductor substrate between these trenches 405 and 406, a first silicon oxide film 402 and a first polysilicon film 403 are formed. Further, the trenches 405 and 406 are both filled with a second silicon oxide film 407a, and further a second silicon oxide film 407b is formed on the side wall portion and the upper surface portion of the first silicon oxide film 402 and the first polysilicon film 403. The end surface of the side wall portion of the second silicon oxide film 407b is used as the mark portion.

FIGS. 5A to 5E are cross-sectional views showing various elements for assistance in explaining the manufacturing method of obtaining the structure as shown in FIG. 4.

First, as shown in FIG. 5A, a first silicon oxide film 402 with a thickness of about 250 angstroms is formed on the semiconductor substrate 401 in accordance with the CVD (chemical vapor deposition) method, and further a first polysilicon film 403 (first film) with a thickness of about 4000 angstroms is formed thereon.

Then, as shown in FIG. 5B, after a photoresist 404 has been applied on the polysilicon film 403, the photoresist is exposed and developed in accordance with photolithography, to etch the first silicon oxide film 402 and the first polysilicon film 403 in such a way that the central portion of the mark portion remains. The semiconductor substrate 401 exposed by this etching is further etched to form two trenches 405 and 406 with a thickness of about 7000 angstroms.

Further, as shown in FIG. 5C, after the photoresist 404 has been removed, a second silicon oxide film 207 (second film) is deposited in accordance with the CVD method, to bury both the trenches 405 and 406. Here, the thickness of the second silicon oxide film 207 is about 10000 angstroms, for instance, which is thicker than the depth of both the trenches 405 and 406.

Figure 5D:
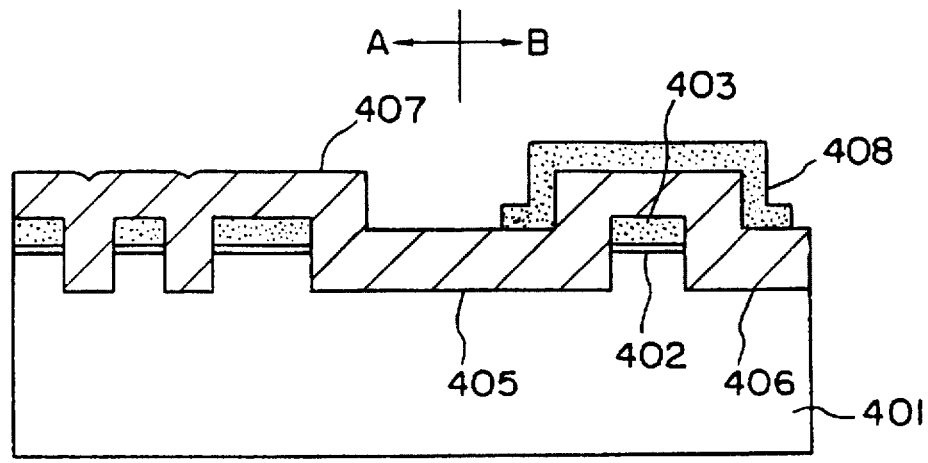

Further, as shown in FIG. 5D, a second polysilicon film 408 with a thickness of about 4000 angstroms is deposited on the second silicon oxide film 407 in accordance with the CVD method, and the second polysilicon film 408 is patterned and etched in accordance with photolithography so that the second polysilicon film 408 (third film) remains only on the side wall and the upper surface of the projected portion between the two trenches 405 and 406.

Figure 5E:
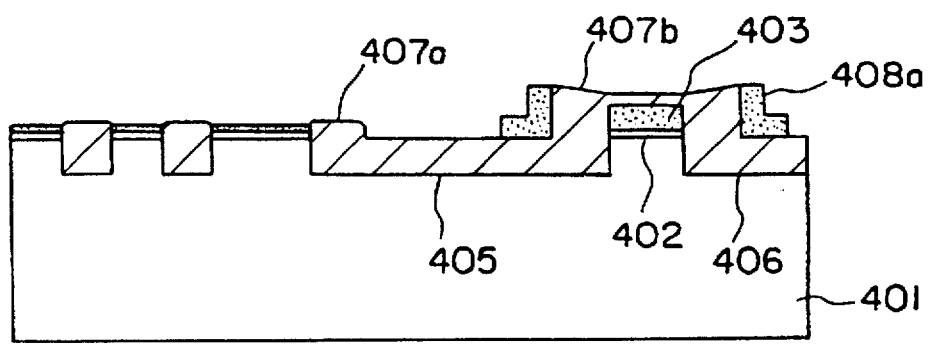

Further, a planarize resist is applied all over the surface of the device, and then the device is etched back by anisotropic etching or polished. In this case, since the second polysilicon film 408 (whose etching speed is slower than that of the second silicon oxide film 407) exists at the mark portion, the second silicon film 407 is not etched as quickly at the mark portion. As a result, as shown in FIG. 5E, at the time point when the second silicon oxide film 407a is etched in the element-separating region to such an extent as to become flush with the first polysilicon film 403, the second polysilicon film 408 is removed only at the uppermost surface thereof at the mark portion, and the second polysilicon film 408a remains on the side wall portion of the second silicon oxide film 407b. Further, in this etching process, although anisotropic etching is adopted, it is possible to remove the third polysilicon film 408 by ordinary polishing.

Further, when the etching process is maintained until the first polysilicon film 403 and the first silicon oxide film 402 can be both removed, since the second polysilicon film 408a can be removed from the mark portion side wall, it is possible to obtain the semiconductor device of the structure as shown in FIG. 4. As described above, since the side wall of the mark portion can be protected by the second polysilicon film 408a until the last processing step, it is possible to obtain a distinct level difference (stepped portion) usable as a mark portion.

Here, in the processing step as explained with reference to FIG. 5D, the material deposited on the second silicon oxide film 407 at the mark portion is not limited only to polysilicon. Any material can be used as long as the etching speed is slower than that of the second silicon oxide film 407. For instance, it is possible to use any material such as a silicon nitride film, a carbon film, or a high melting point metal film (e.g., tungsten, molybdenum, titanium nitride, titanium, nickel, cobalt, platinum, etc.), or a silicide film of these high melting point metal (e.g., a single layer film of tungsten silicide, molybdenum silicide, titanium silicide, tantalum silicide, etc.) or a laminated film of the high melting point metal film and the high melting point metal silicide film.

Figure 6A:
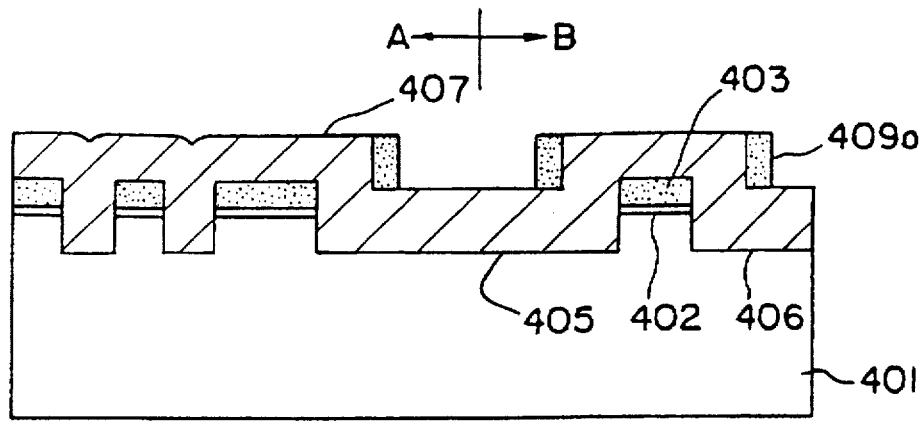
FIGS. 6A to 6C are cross-section views for assistance in explaining a modification of the second embodiment of the manufacturing process of the semiconductor device shown in FIG. 4.
Figure 6B:
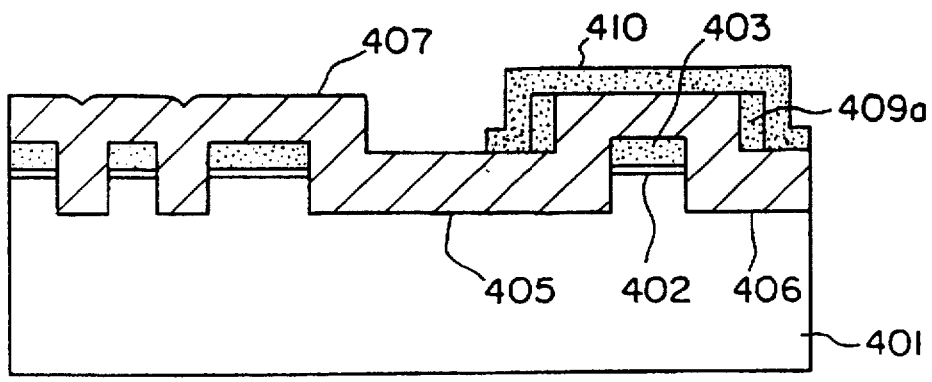
Figure 6C:
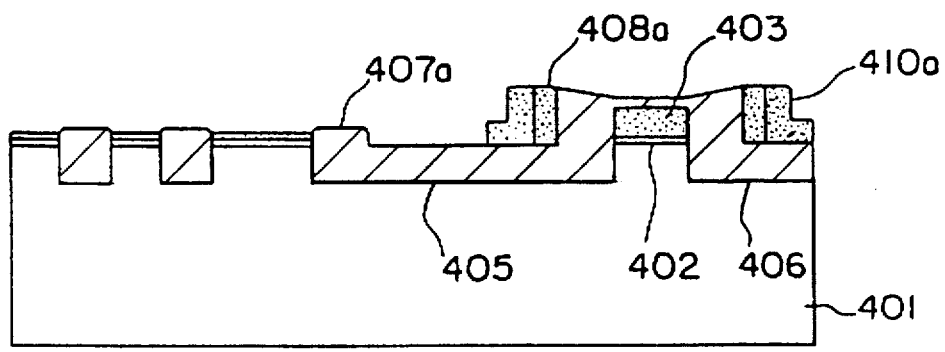

FIGS. 6A to 6C show cross-section views for assistance in explaining a modification of the second embodiment of the manufacturing process of the semiconductor device shown in FIG. 4, which follow after the processing steps as shown in FIGS. 5A to 5C.

As shown in FIG. 6A, a second polysilicon film with a thickness of about 4000 angstroms is deposited on the second silicon oxide film 407 formed in accordance with the CVD method as shown in FIG. 5C, and the deposited film is etched back by anisotropic etching, so that the second polysilicon film 409a remains only on the side walls of the level difference portion of the second silicon oxide film 407.

Further, a third polysilicon film 410 with a thickness of about 4000 angstroms is deposited and further patterned by isotropic etching to leave the third polysilicon film 410 only at the mark portion to obtain the structure as shown in FIG. 6B. The reason why the isotropic etching is used is to remove only the third polysilicon film 410 formed on the side surface of the element-separating portion.

Further, a planarize resist is applied all over the surface of the device, and then the device is etched back by anisotropic etching or polished. In this case, since the third polysilicon film 410 (whose etching speed is slower than that of the second silicon oxide film 407) exists at the mark portion, the second silicon film 407 is not etched as quickly at the mark portion. As a result, as shown in FIG. 6C, at the time point when the second silicon oxide film 407a is etched in the element-separating region to such an extent as to become flush with the first polysilicon film 403, the uppermost surface of the third polysilicon film 410 is removed at the mark portion, so that the second polysilicon film 408a and the third polysilicon film 410a both remain at the side wall thereof. Further, although anisotropic etching is adopted in this embodiment, ordinary polishing can be used.

Further, when the etching process is maintained until the first polysilicon film 403 and the first silicon oxide film 402 are both removed, since the second polysilicon film 408a and the third polysilicon film 410 are both removed from the side wall of the mark portion, it is possible to obtain the semiconductor device of the structure as shown in FIG. 4. In the manufacturing method as described above, since the second and third polysilicon films 408a and 410a are protected on the side wall of the mark portion until the final process, it is possible to obtain a distinct level difference (stepped portion) as the mark.

Here, in the process as explained with reference to FIG. 6A, the material deposited on the second silicon oxide film 407 at the mark portion is not limited only to polysilicon. Any material can be used as long as the etching speed is slower than that of the second silicon oxide film 407. For instance, it is possible to use any material such as a silicon nitride film, a carbon film, or a high melting point metal film (e.g., tungsten, molybdenum, titanium nitride, titanium, nickel, cobalt, platinum, etc.), or a silicide film of these high melting point metals (e.g., a single layer film of tungsten silicide, molybdenum silicide, titanium silicide, tantalum silicide, etc.) or a laminated film of the high melting point metal film and the high melting point metal silicide film.

As described above, in the semiconductor device according to the present invention, since the upper surface of the element-separating region is formed so as to be flush with the surface of the semiconductor substrate and further since at least one of the mark portions is formed so as to project from the substrate surface, it is possible to easily increase the integration rate and to easily recognize the mark portion (level difference).

Further, in a semiconductor device according to the present invention, since the mark portion can be formed into a recessed form (removed pattern) or a projected form (projecting pattern) and further since a buried insulating substance is etched after being covered with a material of slow etching speed, it is possible to obtain a mark portion having a distinct level difference relative to the buried element-separating region.

What is claimed is:

1. A method of manufacturing a semiconductor device, the method comprising:
    forming a first trench in an element-separating region and a second trench in an alignment mark-forming region, wherein both said element-separating region and said alignment mark-forming region are disposed on a semiconductor substrate;
    depositing a first insulating substance all over a surface of the device, to form a first film recessed at a central portion of each of the first and second trenches according to shapes of the first and second trenches;
    depositing a second insulating substance having a first etching rate smaller than a second etching rate of the first insulating substance over the first insulating substance, to form a second film only on the first insulating substance in the second trench;
    reducing a device thickness over the entire surface of the device so that a portion of an upper surface of the first film in the first trench becomes flush with a portion of an upper surface of the semiconductor substrate; and
    completely removing the second film on the first insulating substance in the second trench, wherein a portion of an upper surface of the first film in the second trench in said alignment mark-forming region is different in level from said portion of said upper surface of the semiconductor substrate.

2. The method of claim 1, wherein the reducing of the device thickness includes an anisotropic etching.

3. The method of claim 1, wherein the forming of the second film includes laminating a plurality of films.

4. The method of claim 1, wherein the second film is selected from the group consisting of a silicon nitride film, a polycrystalline silicon film, a carbon film, a high melting point metal film, a high melting point metal silicide film, a laminated film of the high melting point metal film and the high melting point metal silicide film.

5. The method of claim 1, wherein the reducing of the device thickness includes polishing.

6. A method of manufacturing a semiconductor device, the method comprising:
    depositing a first film on a semiconductor substrate;
    forming at least one trench by removing the first film and the semiconductor substrate in both an element-separating region and an alignment mark region, both said element-separating and said alignment mark regions disposed on a surface of the semiconductor substrate, said alignment mark region having an alignment mark portion thereon, wherein said first film is disposed on said alignment mark portion;

forming a second film by depositing an insulating substance all over the surface of the semiconductor substrate and the first film in such a way that the at least one trench is filled and a projection portion is formed, said projection portion including the alignment mark portion and the first film disposed on the alignment mark portion;

forming a third film only on a side surface and an upper surface of the projection portion;

reducing a thickness of the device so that a portion of an upper surface of the second film in said element-separating region becomes flush with a portion of the surface of the semiconductor substrate and said third film remains only on said side surface of said projection portion; and completely removing the third film remaining on the side surface of the projection portion, wherein a portion of an upper surface of the second film in said projection portion is different in level from said portion of the upper surface of the semiconductor substrate.

7. The method of claim 6, wherein the forming of the third film includes laminating a plurality of films.

8. The method of claim 6, wherein the third film is a film selected from the group consisting of a silicon nitride film, a polycrystalline silicon film, a carbon film, a high melting point metal film, a high melting point metal silicide film, a laminated film of the high melting point metal film and the high melting point metal silicide film.

9. The method of claim 6, wherein the reducing of the device thickness includes an anisotropic etching.

10. The method of claim 6, wherein the reducing of the device thickness includes polishing.

11. The method of claim 6, wherein the third film has a first etching rate smaller than a second etching rate of the second film.

12. The method of claim 11, wherein the third film is a film selected from the group consisting of a silicon nitride film, a polycrystalline silicon film, a carbon film, a high melting point metal film, a high melting point metal silicide film, a laminated film of the high melting point metal film and the high melting point metal silicide film.

* * * * *